US007898991B2

(12) United States Patent
Cole

(10) Patent No.: US 7,898,991 B2
(45) Date of Patent: *Mar. 1, 2011

(54) SERIALIZER/DESERIALIZER TEST MODES

(75) Inventor: Christopher R. Cole, Redwood City, CA (US)

(73) Assignee: Finisar Corporation, Sunnyvale, CA (US)

( * ) Notice: Subject to any disclaimer, the term of this patent is extended or adjusted under 35 U.S.C. 154(b) by 153 days.

This patent is subject to a terminal disclaimer.

(21) Appl. No.: 12/252,649

(22) Filed: Oct. 16, 2008

(65) Prior Publication Data

US 2010/0097942 A1  Apr. 22, 2010

(51) Int. Cl.
*H04L 12/50* (2006.01)
(52) U.S. Cl. ..................................... 370/271
(58) Field of Classification Search ............... None
See application file for complete search history.

(56) References Cited

U.S. PATENT DOCUMENTS

| | | | | |
|---|---|---|---|---|
| 5,103,448 A * | 4/1992 | Barnes et al. | 370/280 |
| 5,311,516 A * | 5/1994 | Kuznicki et al. | 370/314 |
| 5,715,239 A * | 2/1998 | Hyodo et al. | 370/248 |
| 5,870,390 A * | 2/1999 | Campanella | 370/326 |
| 6,300,786 B1 * | 10/2001 | Doherty et al. | 324/765 |
| 7,474,612 B1 | 1/2009 | Patel | |
| 2002/0034197 A1 | 3/2002 | Tornetta et al. | |
| 2002/0097682 A1 * | 7/2002 | Enam et al. | 370/241 |
| 2003/0039168 A1 | 2/2003 | Chan et al. | |
| 2003/0223465 A1 * | 12/2003 | Blanchard | 370/537 |
| 2005/0089126 A1 | 4/2005 | Zerbe et al. | |
| 2005/0169585 A1 | 8/2005 | Aronson et al. | |
| 2006/0209710 A1 * | 9/2006 | Watanabe | 370/252 |
| 2008/0205437 A1 * | 8/2008 | Cole | 370/464 |
| 2009/0080584 A1 | 3/2009 | Hamano et al. | |
| 2009/0207057 A1 | 8/2009 | Diab | |

OTHER PUBLICATIONS

SerDes Framer Interface Level5 (SFI-5): Implementation Agreement for 40Gb/s Interface for Physical Layer Devices, OIF-SF15-01.02, Jan. 29, 2002, pp. 8, 17-19.
U.S. Appl. No. 12/039,669, Mail Date Oct. 6, 2006, Office Action.
U.S. Appl. No. 12/039,669, Mail Date Feb. 4, 2010, Notice of Allowance.

* cited by examiner

*Primary Examiner*—Chi H Pham
*Assistant Examiner*—Fan Ng
(74) *Attorney, Agent, or Firm*—Workman Nydegger

(57) ABSTRACT

Serializer, deserializer, and/or serdes ICs are configured to support one or more test modes to enable end-to-end testing in communication links in which the ICs are implemented. To support the end-to-end testing, the ICs can include a multiplexing stage with means for deterministically mapping a plurality of input parallel data signals to at least one output serial data signal and/or a demultiplexing stage with means for deterministically mapping at least one input serial data signal to a plurality of output parallel data signals. When used in combination in a communication link, the means included in the multiplexing stage and demultiplexing stage deterministically map specific input parallel data signals to specific output parallel data signals.

19 Claims, 8 Drawing Sheets

SERIALIZER/DESERIALIZER TEST MODES

BACKGROUND OF THE INVENTION

1. The Field of the Invention

The present invention generally relates to the testing of physical data paths in communications networks. More particularly, some example embodiments of the invention relate to serializer, deserializer, and/or serdes integrated circuits ("ICs") with at least one test mode enabling end-to-end testing of physical data paths.

2. The Related Technology

The IEEE 802.3ba Task Force has adopted a 4×25 gigabit per second ("G") architecture for 100 G 10 km and 40 km single mode fiber ("SMF") polarization mode dispersion ("PMD") optical interface and a 10×10 G architecture ("CAUI") for 100 G electrical interface. This requires a 10:4 mapping function—implemented in a serializer or serdes—to convert between the 10×10 G and 4×25 G interfaces on the transmit side, and a 4:10 mapping function—implemented in a deserializer or serdes—to convert between the 4×25 G and 10×10 G interfaces on the receive side.

A side-effect of this architecture is that there is no deterministic mapping between a 10 G electrical lane and a 25 G optical lane. Further, none of the 10:4/4:10 mapping functions allow deterministic mappings between 10 G input lanes on the transmit side and 10 G output lanes on the receive side. In other words, data on a given input lane, such as TX_0 on the transmit side, does not necessarily come out on the corresponding output lane, such as RX_0 on the receive side. The non-deterministic nature of the mappings complicates testing because it makes it impossible to make end-to-end tests of specific physical paths. Further, testing of the 25 G serial lanes typically requires 25 G test equipment, which is substantially more expensive than 10 G test equipment used to test the 10 G parallel lanes.

The subject matter claimed herein is not limited to embodiments that solve any disadvantages or that operate only in environments such as those described above. Rather, this background is only provided to illustrate one exemplary technology area where some embodiments described herein may be practiced

BRIEF SUMMARY OF THE INVENTION

These and other limitations are overcome by embodiments of the invention which relate to systems and methods for deterministically mapping parallel data signals to serial data signals and vice versa.

One embodiment of the invention includes a multiplexing stage that can be implemented in a serializer or serdes IC to deterministically map input parallel data signals to output serial data signals. The multiplexing stage can include multiple input demultiplexers coupled to multiple synchronizing flip flops coupled to at least one output multiplexer. The input demultiplexers demultiplex multiple parallel data signals into multiple demultiplexed signals. The synchronizing flip flops synchronize the demultiplexed signals into multiple retimed signals. The at least one output multiplexer samples the retimed signals in a pre-defined order to generate at least one serial data signal. The multiplexing stage further includes means for deterministically mapping the parallel data signals to the at least one serial data signal coupled between the at least one output multiplexer and at least one of the synchronizing flip flops.

Another embodiment of the invention includes a demultiplexing stage that can be implemented in a deserializer or a serdes IC to deterministically map input serial data signals to output parallel data signals. The demultiplexing stage can include at least one input demultiplexer coupled to multiple synchronizing flip flops coupled to multiple output multiplexers. The at least one input demultiplexer demultiplexes at least one serial data signal into multiple demultiplexed signals. The synchronizing flip flops synchronize the demultiplexed signals into multiple retimed signals. The output multiplexers multiplex the retimed signals into multiple parallel data signals. The demultiplexing stage further includes means for deterministically mapping the at least one serial data signal to the parallel data signals coupled between the at least one input demultiplexer and at least one of the synchronizing flip flops.

Another embodiment of the invention includes a method of deterministically mapping multiple input parallel data signals to at least one output serial data signal having the same aggregate data rate. The method begins by receiving the input parallel data signals at a first optoelectronic device. One of the input parallel data signals is replaced with a test signal. The test signal and the other input parallel data signals are multiplexed into the output serial data signal, the test signal acting as a marker enabling the correlation of each bit in each output serial data signal with a particular one of the input parallel data signals. Finally, the output serial data signal is transmitted to a second optoelectronic device that receives it, demultiplexes it into multiple output parallel data signals, and attempts to lock on to the test signal.

Yet another embodiment of the invention includes a method of deterministically mapping at least one input serial data signal to multiple output parallel data signals having the same aggregate data rate. The method includes receiving the input serial data signal from a first optoelectronic device at a second optoelectronic device. The input serial data signal is demultiplexed into multiple demultiplexed data signals that include a test signal. The second optoelectronic device searches for the test signal on a specific one of a plurality of signal lanes and locks on to the test signal when it is found on the specific one of the plurality of signal lanes.

Additional features of the invention will be set forth in the description which follows, and in part will be obvious from the description, or may be learned by the practice of the invention. The features of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Figure 1:
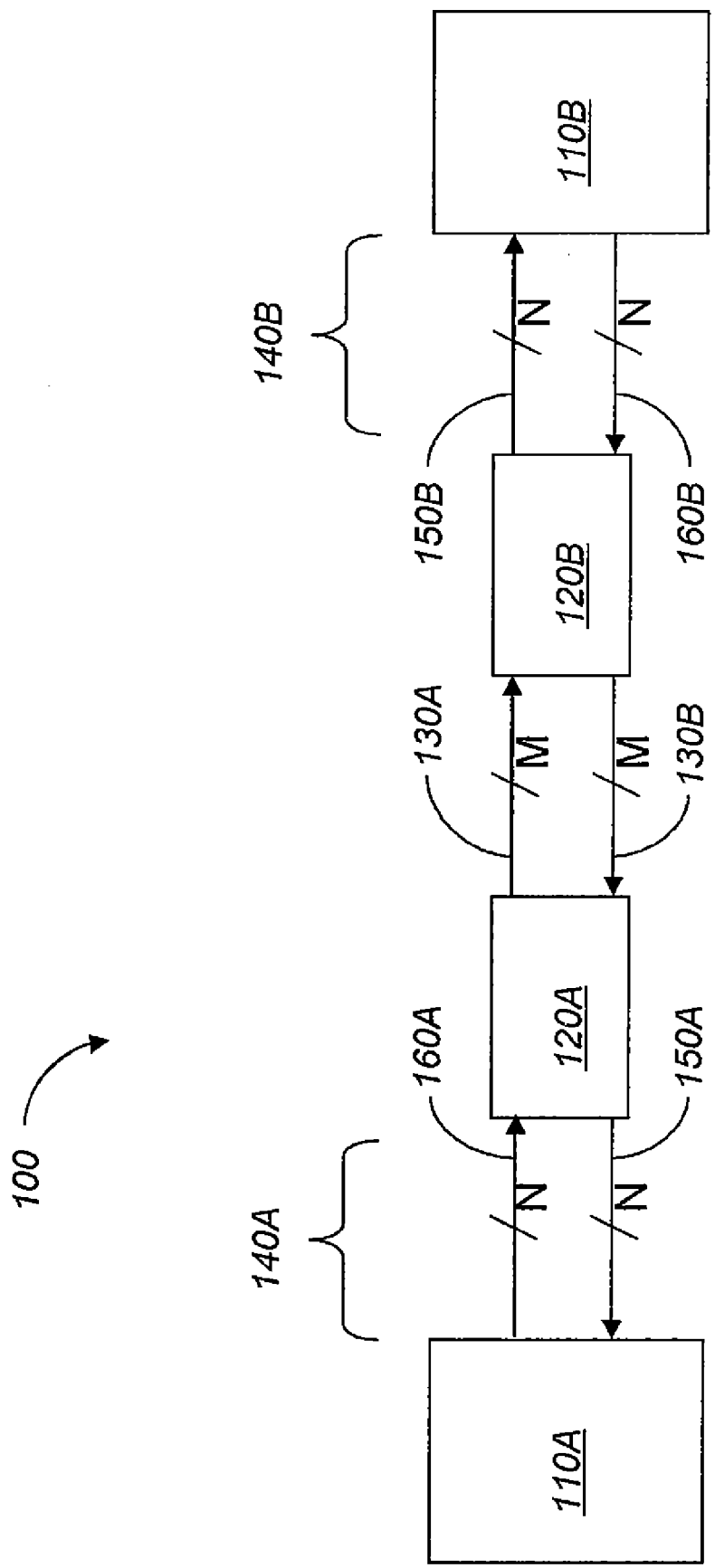
FIG. 1 illustrates an example communication link in which embodiments of the invention can be implemented.

In general, embodiments of the invention are concerned with the testing of physical data paths in communications networks. More particularly, embodiments of the invention enable the end-to-end testing of physical data paths that include an N:M parallel-to-serial mapping function at a transmit end and an M:N serial-to-parallel mapping function at a corresponding receive end. In some example embodiments, this is accomplished by replacing one or more input parallel data signals at the transmit end with a test signal that can be recognized on the receiving end. Some embodiments of the invention enable relatively lower-speed and lower-cost test equipment to be used to test high-speed links.

Briefly, in an example communication link, a plurality of input parallel data signals are converted to one or more serial data signals at the transmit end of the link and transmitted to the receive end of the link. The one or more serial data signals are then converted to a plurality of output parallel data signals at the receive end of the link. Some embodiments of the invention enable testing of all but one of the parallel signal lanes by allowing one of the parallel signal lanes to be used for sending the test signal. Other embodiments of the invention enable testing of all of the parallel signal lanes by allowing either one of two parallel signal lanes to be used for sending the test signal.

Embodiments of the invention can be implemented in various optoelectronic devices. As used herein, the term "optoelectronic device" includes devices having both optical and electrical components. Examples of optoelectronic devices include, but are not limited to, transponders, transceivers, transmitters, and/or receivers. Optoelectronic devices can be used, for instance, in telecommunications networks, local area networks, metro area networks, storage area networks, wide area networks, and the like and can be configured to conform with one or more standardized form factors or multi-source agreements ("MSAs"). It will be appreciated, however, that the optoelectronic devices need not comply with standardized form factor requirements and may have any size or configuration necessary according to a particular design.

Optoelectronic devices according to embodiments of the invention can be configured for optical signal transmission and reception at a variety of per-second data rates including, but not limited to, 10 Gigabits per second ("G"), 40 G, 100 G, or higher. As used herein, the terms "10 G", "40 G", "100 G", and similar terms represent rounded approximations of common signaling rates and have the meanings commonly understood by those of skill in the art.

Furthermore, the optoelectronic devices according to embodiments of the invention can be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, or 1610 nm. Further, the optoelectronic devices can be configured to support various transmission standards including, but not limited to, 10 Gigabit Ethernet, 100 Gigabit Ethernet, and 1x, 2x, 4x, and 10x Fibre Channel.

I. Example Operating Environment

Reference will now be made to the drawings to describe various aspects of exemplary embodiments of the invention. It should be understood that the drawings are diagrammatic and schematic representations of such exemplary embodiments and, accordingly, are not limiting of the scope of the present invention, nor are the drawings necessarily drawn to scale.

FIG. 1 illustrates an example communication link 100 ("link 100") in which embodiments of the invention may be implemented. The link 100 facilitates bidirectional (e.g., duplex) communication (optical and/or electrical) between a first host 110A and a second host 110B via one or more optical fibers 130A and 130B or other transmission media. The link 100 additionally includes a first optoelectronic device 120A ("first device 120A") operably connected to the first host 110A, and a second optoelectronic device 120B ("second device 120B") operably connected to the second host 110B.

In this example, an electrical interface 140A is provided between the first host 110A and the first device 120A for conveying electrical data between the first host 110A and the first device 120A. The electrical interface 140A includes a plurality of receive signal lanes 150A, the number of receive signal lanes represented by the letter "N," and an equivalent number of transmit signal lanes 160A. As used herein, a "signal lane" refers to all or a portion of a physical path for guiding a signal from one location to another. Signal lanes can include wires, traces, circuits, optical fibers, or the like or any combination thereof. The N receive signal lanes and N transmit signal lanes allow up to N data signals to be communicated from the first host 110A to the first device 120A and from the first device 120A to the first host 110A. Similarly, an electrical interface 140B is provided between the second host 110B and the second device 120B for conveying electrical data between the second host 110B and the second device 120B, the electrical interface 140B including N receive signal lanes 150B and N transmit signal lanes 160B.

The electrical interfaces 140A, 140B can implement any one of numerous aggregate data rates. For example, in some embodiments the aggregate data rate in each direction of electrical interfaces 140A and 140B is substantially equal to 100 G, although the aggregate data rate in each direction of electrical interfaces 140A and 140B can alternatively be higher or lower than 100 G in other embodiments. Additionally, the electrical interfaces 140A, 140B can implement any one of numerous architectures for any given aggregate data rate. As used herein, "architecture" refers to the number of transmit or receive signal lanes and the supported data rate per lane. For instance, for a 100 G aggregate data rate, the architectures implemented by the electrical interfaces 140A, 140B can include 10×10 G, 8×12.5 G, 12×8.33 G, or the like. Accordingly, embodiments of the invention are not limited to a particular aggregate data rate or architecture for the electrical interfaces 140A, 140B.

In operation, the first device 120A receives N parallel data signals from the first host 110A via the N transmit signal lanes 160A, maps the N parallel data signals to one or more ("M") serial data signals and emits M optical data signals representative of the M serial data signals onto optical fiber(s) 130A. The first device 120A can implement wavelength division multiplexing ("WDM"), parallel optics, in-phase and quadrature-phase ("I and Q") channels, or the like when emitting the M optical data signals onto optical fiber(s) 130A. The second device 120B receives the M optical data signals, converts them to M serial data signals, and maps the M serial data signals to N parallel data signals which are provided to the second host 110B via the N receive signal lanes 150B. In a similar manner, the second device 120B can map parallel data signals received from the second host 110B via N transmit signal lanes 160B to serial data signals which are optically transmitted to the first device 120A via optical fiber(s) 130B where they are converted and mapped to parallel data signals and provided to the first host 110A via N receive signal lanes 150A.

To perform the N:M parallel-to-serial mappings when transmitting data and/or the M:N serial-to-parallel mappings when receiving data, each of the first and second devices 120A, 120B can include one or more serializer ICs, deserializer ICs, and/or serdes ICs. According to embodiments of the invention, the one or more serializer ICs, deserializer ICs, and/or serdes ICs are configured to support one or more test modes to enable end-to-end testing between the first and second hosts 110A and 110B, for example.

II. Example Optoelectronic Device

Figure 2:
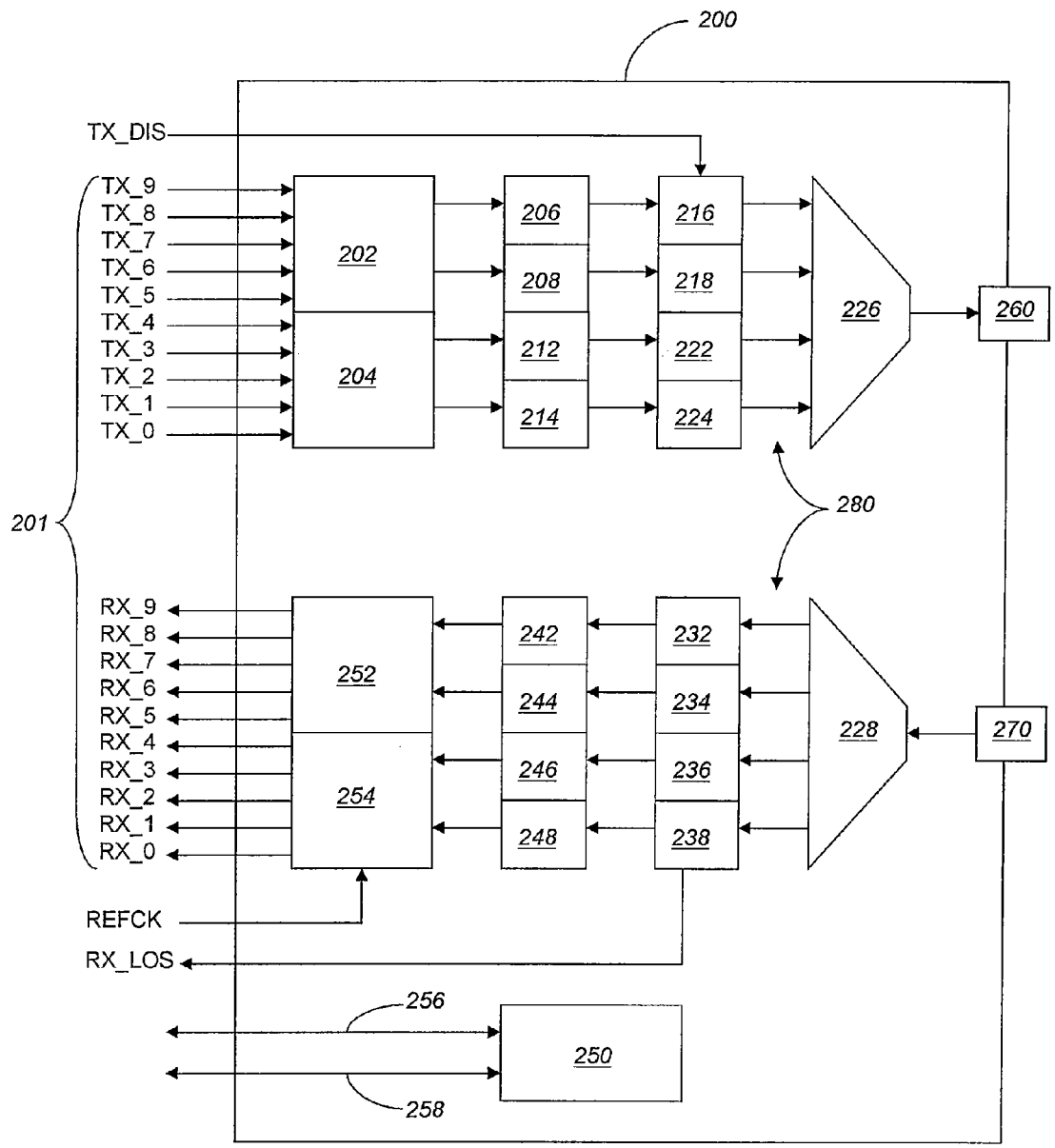
FIG. 2 depicts an example optoelectronic device that can be implemented in the communication link of FIG. 1.

FIG. 2 discloses an example optoelectronic device 200 ("device 200") that may correspond to the first and/or second devices 120A, 120B of FIG. 1. While the device 200 will be described in some detail, the device 200 is described by way of illustration only, and not by way of restricting the scope of the invention. In particular, some of the components included in the device 200 may or may not be implemented in all embodiments. For instance, the device 200 can include an optical multiplexer ("MUX") and/or demultiplexer ("DEMUX") to implement coarse or dense WDM. Alternately, the optical MUX and/or DEMUX can be omitted if the optoelectronic device 200 implements parallel optics or I and Q channels.

The optoelectronic device 200 can include an electrical interface 201, a plurality of serializers 202, 204, a plurality of modulation drivers 206, 208, 212, 214, a plurality of optical transmitters 216, 218, 222, 224, an optical MUX 226, an optical DEMUX 228, a plurality of optical receivers 232, 234, 236, 238, a plurality of post amplifiers 242, 244, 246, 248, a plurality of deserializers 252, 254, and a microcontroller 250.

The electrical interface 201 is configured to support an aggregate data rate substantially equal to 100 G in each direction, the electrical interface 201 implementing a 10×10 G architecture and including ten transmit signal lanes TX_0-TX_9 for receiving ten 10 G data signals from a host device (not shown), and ten receive signal lanes RX_0-RX_9 for providing ten 10 G data signals to the host device (not shown). Alternately, the electrical interface 201 can be configured for an aggregate data rate higher or lower than 100 G and/or can implement architectures other than the 10×10 G architecture.

Each serializer 202, 204 is operably connected to a different half of the ten transmit signal lanes TX_0-TX_9, allowing each serializer 202, 204 to receive a different half of the data signals from the host device (not shown). The serializers 202, 204 in the embodiment of FIG. 2 each provide a 5:2 parallel-to-serial mapping function to collectively serialize the ten 10 G data signals into four 25 G serial data signals. In other embodiments there may be more or fewer than two serializers 202, 204 that provide the same or different mapping functions.

In the embodiment of FIG. 2, each serializer 202, 204 is implemented individually on a separate IC. Alternately or additionally, both serializers 202, 204 can be combined in a single IC. Alternately or additionally, one or both of the serializers 202, 204 can be combined with one or both of the deserializers 252, 254 in a single serdes IC.

Modulation drivers 206, 208, 212, 214 receive the serial data signals generated by the serializers 202, 204 and drive optical transmitters 216, 218, 222, 224 to emit optical data signals representative of the information carried in the corresponding serial data signal. The emitted optical data signals are optically multiplexed by optical MUX 226 and transmitted onto optical fiber 260.

The device 200 is also configured to receive one or more optical data signals from optical fiber 270, which are optically demultiplexed by optical DEMUX 228. The demultiplexed optical data signals are converted to electrical serial data signals by optical receivers 232, 234, 236, 238 and amplified by post amplifiers 242, 244, 246, 248.

The deserializers 252, 254 each receive half of the amplified serial data signals and provide a 2:5 serial-to-parallel mapping function to collectively deserialize the four serial data signals into ten 10 G parallel data signals, which are provided to a host (not shown) via the ten receive signal lanes RX_0-RX_9. In other embodiments there may be more or fewer than two deserializers 252, 254 that provide the same or different mapping functions.

In the embodiment of FIG. 2, each deserializer 252, 254 is implemented individually on a separate IC. Alternately or additionally, both deserializers 252, 254 can be combined in a single IC. Alternately or additionally, one or both of the deserializers 252, 254 can be combined with one or both of the serializers 202, 204 in a single serdes IC.

The microcontroller 250 can optimize the dynamically varying performance of the device 200 by, for example, adjusting settings on each of the modulation drivers 206, 208, 212, 214 and/or post amplifiers 242, 244, 246, 248. Various interfaces, including firmware I/O interface 256 and/or hardware I/O interface 258, may permit the microcontroller 250 to communicate directly with a host (not shown) and/or components within the device 200.

In the embodiment of FIG. 2, the device 200 includes optical interface 280 configured for an aggregate data rate substantially equal to 100 G for both transmit and receive, the optical interface 280 implementing a 4×25 G architecture. In other embodiments of the invention, the optical interface 280 can be configured for an aggregate data rate higher or lower than 100 G and/or can implement architectures other than 4×25 G.

III. Test-Mode Enabled Serializer

Figure 3:
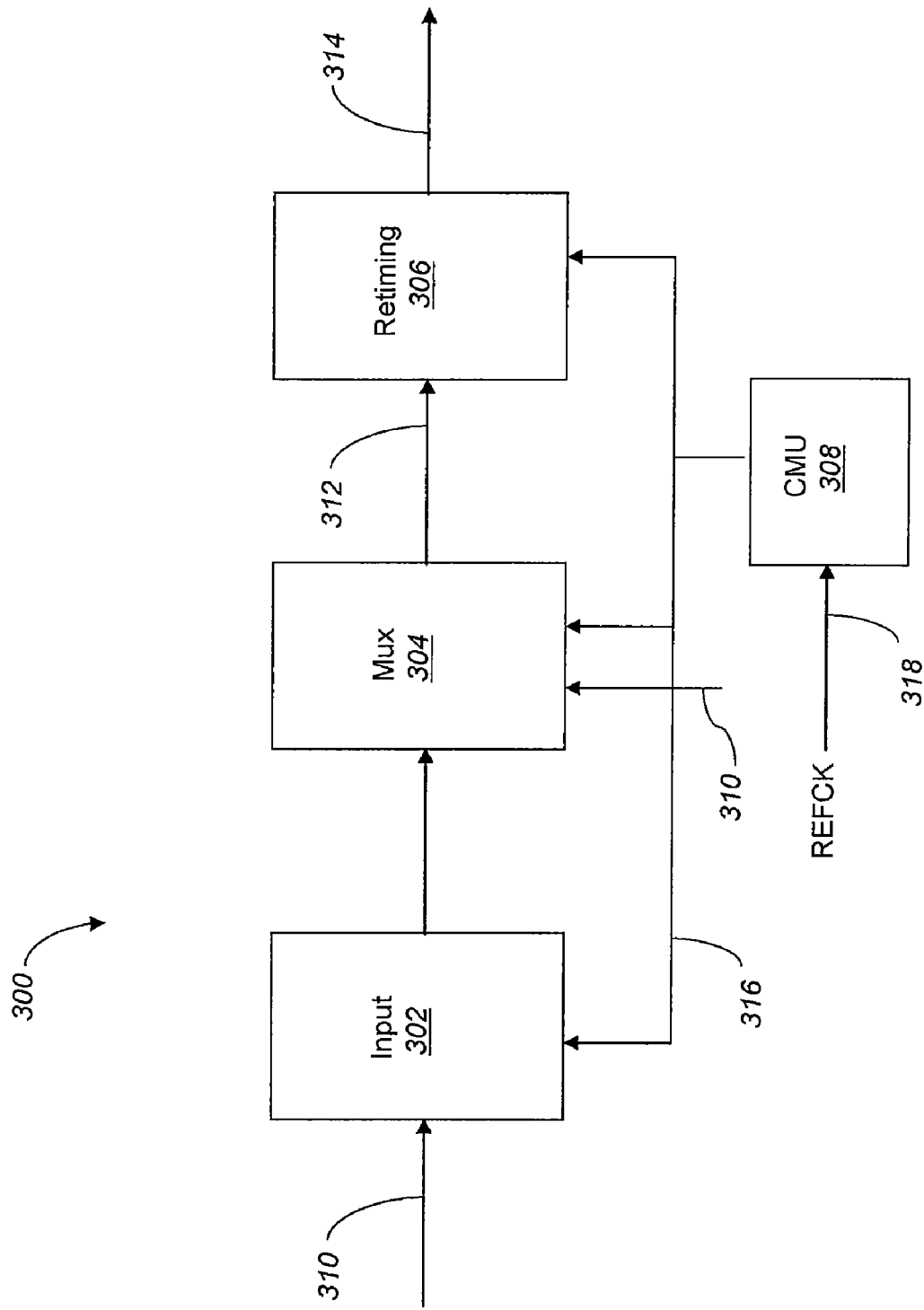
FIG. 3 illustrates an embodiment of a test-mode enabled serializer IC.

Now with reference to FIG. 3, a serializer 300 is disclosed that may correspond to one or more of the serializers 202, 204 of FIG. 2 and/or that can be implemented in the first or second device 120A, 120B of FIG. 1. As such, the serializer 300 can be configured to serialize five, e.g., half, of ten parallel data signals received from a host via the electrical interface 201 of FIG. 2 into two serial data signals, while a second similarly configured serializer serializes the other five parallel data signals into two other serial data signals. Alternately, the serializer 300 can be configured to serialize more or less than half of a plurality of parallel data signals received from a host via an electrical interface into more or less than two serial data signals. Furthermore, the serializer 300 is configured to support one or more test modes to enable the end-to-end testing of specific signal lanes in a communication link, such as the link 100 of FIG. 1, as will be described in greater detail below.

FIG. 3 illustrates a simplified block view of example serializer 300. The serializer 300 includes an input stage 302, multiplexing stage 304, retiming stage 306, and a clock multiplier unit ("CMU") 308. One or more mode-selection signals 310 can be provided by a microcontroller, for example, to control one or more of the components 302-308 of the serializer 300. For instance, mode-selection signal 310 can enable one or more test modes in the multiplexing stage 302.

The input stage 302 is coupled to multiplexing stage 304, which is coupled to retiming stage 306. Note that, as used herein, "coupled to" is defined to mean both a direct connection between two or more circuit objects without any intervening circuit objects and an indirect connection between two or more circuit objects with one or more intervening circuit objects. For example, two objects directly connected to each other are "coupled to" one another. The same two circuit objects would also be "coupled to" each other if there was one or more intervening circuit objects connected between them.

In operation, input stage 302 receives a plurality of parallel data signals 310 from a host and provides the received parallel data signals 310 to multiplexing stage 304. The multiplexing stage 304 multiplexes or "maps" the parallel data signals 310 to a plurality of serial data signals 312 which are retimed by retiming stage 306 into retimed serial data signals 314.

In some embodiments the multiplexing stage 304 provides a 5:2 parallel-to-serial mapping function, mapping 5×10 G parallel data signals to 2×25 G serial data signals. Alternately or additionally, the multiplexing stage 302 can provide one or more of countless other parallel-to-serial mappings. For example, the multiplexing stage 302 can provide a 10:4 or 16:1 parallel-to-serial mapping function, or the like.

In the multiplexing stage of conventional serializers, the mapping of parallel data signals to serial data signal(s) is non-deterministic, meaning it is difficult or impossible to determine which time slot in an output serial data signal corresponds to which input parallel data lane. The non-deterministic nature of the parallel-to-serial mapping can thus complicate the testing of specific input and/or output signal lanes of a conventional serializer. As will be explained below, however, the multiplexing stage 304 according to embodiments of the invention can include means for deterministically mapping a plurality of input parallel data signals to one or more output serial data signals.

A high-speed clock signal 316 can be generated by CMU 308 for processing one or more of data signals 310, 312, 314. The high-speed clock signal 316 can be generated by multiplying up a reference clock signal ("REFCK") 318.

Figure 4A:
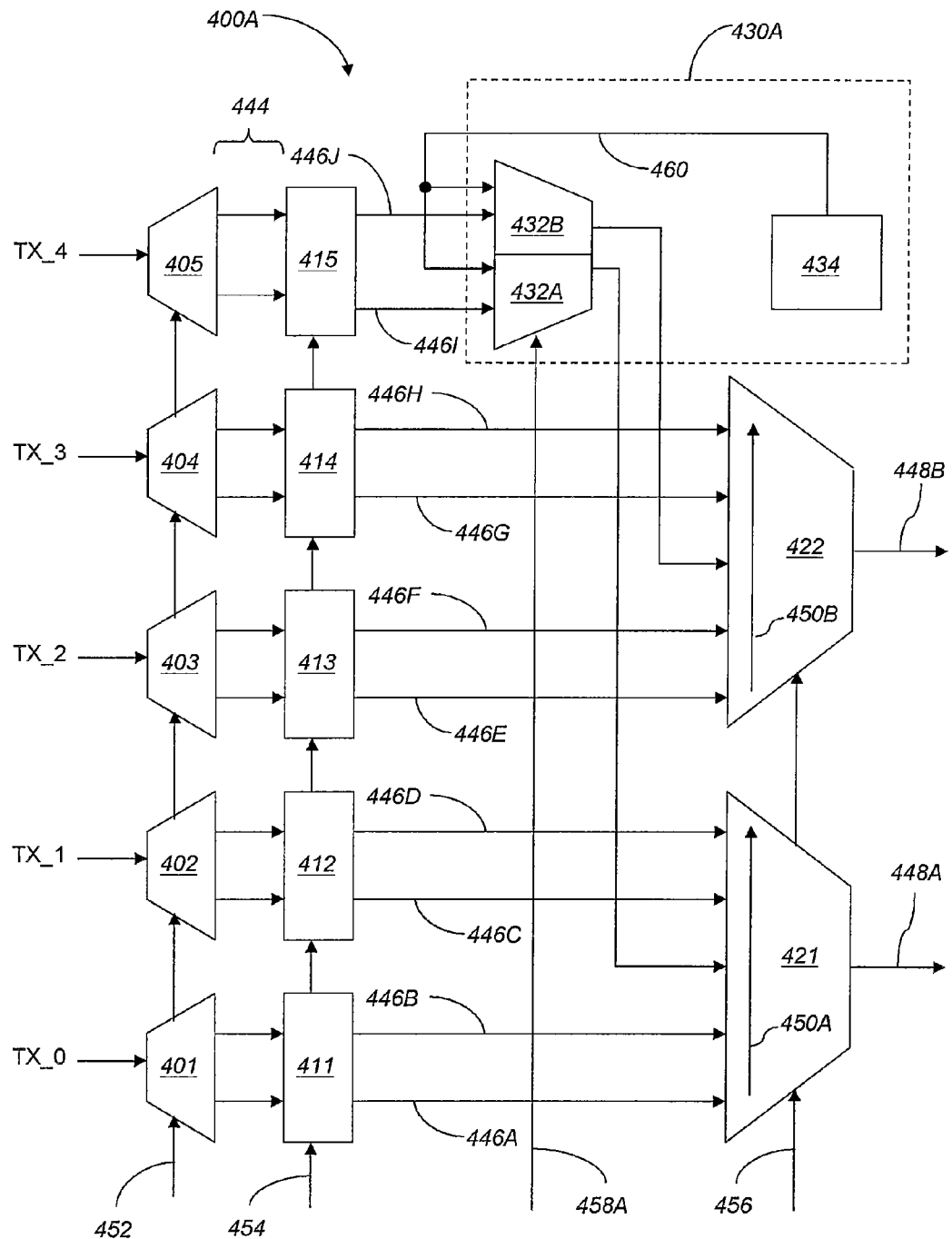
FIGS. 4A and 4B illustrate two embodiments of a multiplexing stage that can be included in the serializer IC of FIG. 3 to enable one or more test modes.

With additional reference to FIG. 4A, one embodiment of a multiplexing stage 400A is disclosed that may correspond to the multiplexing stage 304 of FIG. 3. The multiplexing stage 400A includes a plurality of input demultiplexers 401-405 coupled to a plurality of synchronizing flip flops 411-415 coupled to one or more output multiplexers 421-422. Additionally, the multiplexing stage 400 includes means 430A for deterministically mapping a plurality of input parallel data signals to one or more output serial data signals ("means 430A").

As shown, the means 430A are coupled between the synchronizing flip flops 411-415 and output multiplexers 421-422. More particularly, the means 430A are coupled between synchronizing flip flop 415 and output multiplexers 421-422. In the embodiment disclosed in FIG. 4A, the means 430A includes first and second static multiplexers 432A and 432B and a test signal generator 434. The test signal generator 434 can comprise a pseudo-random bit stream ("PRBS") generator 434 in some embodiments.

In operation, the input demultiplexers 401-405 demultiplex a plurality of input parallel data signals received on data lanes TX_0-TX_4 from, e.g., the input stage 302 of the serializer 300 of FIG. 3, into a plurality of demultiplexed data signals 444. The demultiplexed data signals 444 are clocked out of the input demultiplexers 401-405 and into the synchronizing flips flops 411-415. The synchronizing flip flops 411-415 synchronize the demultiplexed data signals 444 and provide retimed data signals to output demultiplexers 421-422 via signal lanes 446A-446J (referred to collectively herein as "signal lanes 446").

The output multiplexers 421-422 multiplex the retimed data signals from signal lanes 446 to generate serial data signals 448A and 448B. In some embodiments, multiplexing the retimed data signals from signal lanes 446 to generate serial data signals 448A and 448B includes sampling the retimed data signals on the signal lanes 446 in a pre-defined order 450A, 450B. For instance, the pre-defined order 450A of output multiplexer 421 samples data from signal lane 446A, followed by signal lane 446B, followed by the signal lane from first static multiplexer 432A, followed by signal lane 446C, followed by signal lane 446D. Similarly, the pre-defined order 450B of output multiplexer 422 samples data from signal lane 446E, followed by signal lane 446F, followed by the signal lane from second static multiplexer 432B, followed by signal lane 446G, followed by signal lane 446H. The pre-defined orders 450A and 450B are provided by way of example only and represent just two of numerous pre-defined orders that can be implemented by the output multiplexers 421-422 according to embodiments of the invention.

One or more clock signals 452, 454, 456 can be provided to the input demultiplexers 401-405, synchronizing flip flops 411-415, and output multiplexers 421-422 during operation of the multiplexing stage 400A. In some embodiments, the one or more clock signals 452, 454, 456 correspond to the high-speed clock signal 316 generated by the CMU 308 of FIG. 3.

Additionally, a control signal 458A can enable one or more test modes in the multiplexing stage 400A in conjunction with means 430A. The control signal 458A can be provided by a micro-controller (not shown) and may correspond to the control signal 310 of FIG. 3. In some embodiments, the multiplexing stage 400A is configured for normal operation and a single test mode. During normal operation, the control signal 458A disables test mode such that each of the first and second static multiplexers 432A and 432B selects retimed data signals from signal lanes 446I or 446J, respectively, and provides the retimed data signal to output multiplexer 421 or 422, respectively. In normal operation then, multiplexing stage 400A maps all of the data from TX_0 and TX_1 as well as half of the data from TX_4 to serial data signal 448A; all of the data from TX_2 and TX_3 and the other half of the data from TX_4 are mapped to serial data signal 448B.

Alternately, the control signal 458A can enable test mode such that the first and second static multiplexers 432A and 432B select a test signal 460 from the test signal generator 434 and provide the test signal 460 to output multiplexers 421-422 in place of the retimed data signals from signal lanes 446I and 446J corresponding to TX_4. The test signal 460 comprises a PRBS signal in some embodiments. In test mode, multiplexing stage 400A maps all of the data from TX_0 and TX_1 as well as test signal 460 to serial data signal 448A; all of the data from TX_2 and TX_3 and test signal 460 are mapped to serial data signal 448.

In test mode in the embodiment of FIG. 4A, each of the output multiplexers 421-422 multiplexes test signal 460 and a different four of the retimed data signals from signal lanes 446 into one serial data signal 448A or 448B; consequently, every fifth bit of each of the serial data signals 448A, 448B is internally generated by the test signal generator 434 during test mode. The internally generated fifth bit on each of serial data signals 448A and 448B acts as a marker enabling the correlation of each bit in each serial data signal 448A and 448B with a particular one of the parallel data signals TX_0-TX_3. Note, however, that in the test mode of multiplexing stage 400A, TX_4 data is replaced with test signal 460, preventing end-to-end testing of TX_4.

Figure 4B:
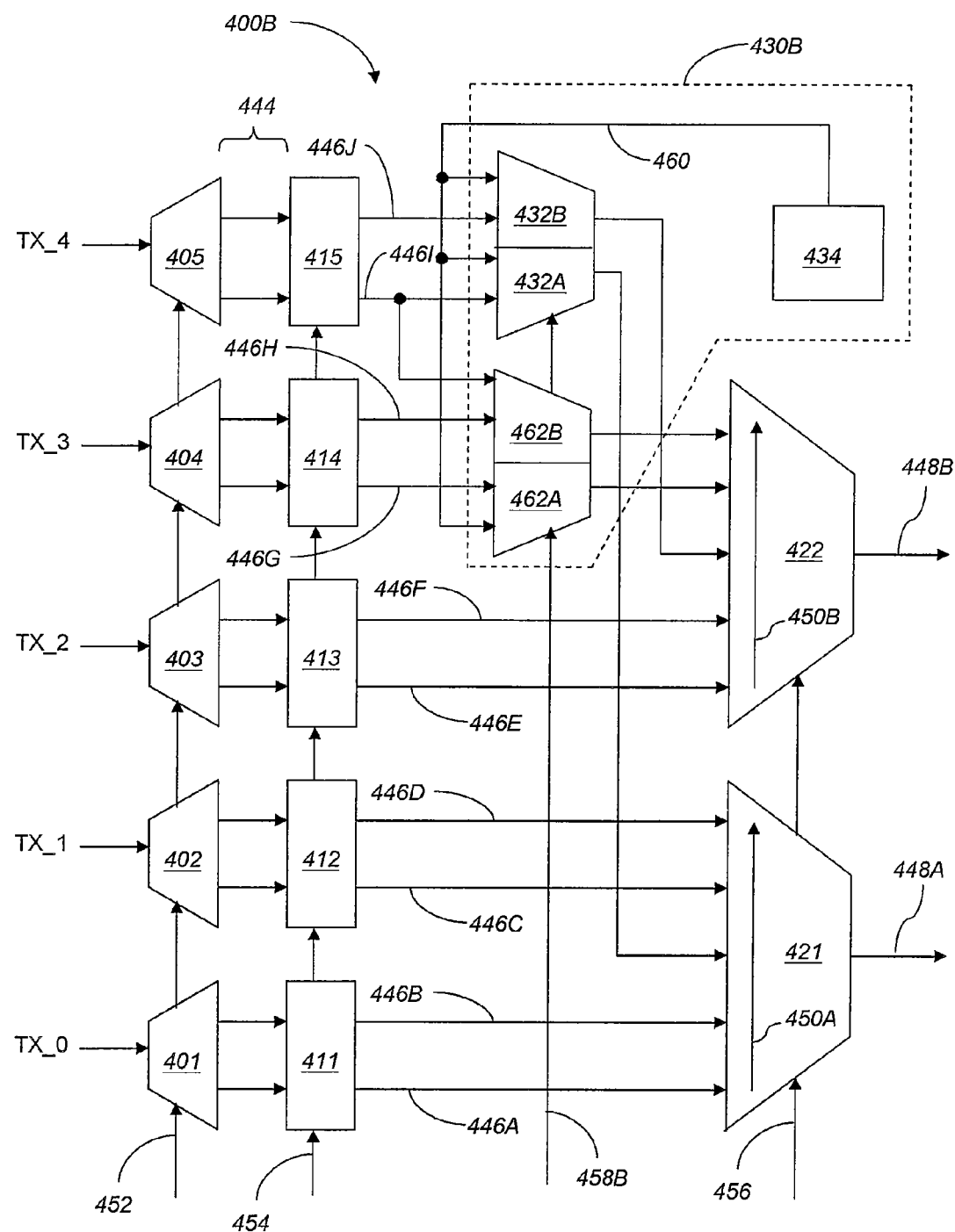

Turning now to FIG. 4B, a second embodiment of a multiplexing stage 400B is disclosed that may correspond to the multiplexing stage 304 of FIG. 3. The multiplexing stage 400B of FIG. 4B is similar in some respects to the multiplexing stage 400A of FIG. 4A and can comprise some of the same components, including input demultiplexers 401-405 coupled to synchronizing flip flops 411-415 coupled to one or more output multiplexers 421-422. In contrast to multiplexing stage 400A, however, multiplexing stage 400B includes means 430B for deterministically mapping a plurality of parallel data signals to one or more serial data signals that further enables end-to-end testing of all of the input parallel signal lanes TX_0-TX_4 ("means 430B").

As shown, means 430B are coupled between synchronizing flip flops 411-415 and output multiplexers 421-422. In the embodiment of FIG. 4B, the means 430B includes first and second static multiplexers 432A and 432B, test signal generator 434, and third and fourth static multiplexers 462A and 462B.

In some embodiments, the multiplexing stage 400B can be configured for normal operation and two different test modes. During normal operation, control signal 458B disables test mode such that each of the first and second static multiplexers 432A and 432B selects a retimed data signal from signal lanes 446I or 446J, respectively, and provides the retimed data signal to output multiplexer 421 or 422, respectively. Additionally, each of the third and fourth static multiplexers 462A and 462B selects a retimed data signal from signal lane 446G or 446H, respectively, and provides the retimed data signal to output multiplexer 422. The mapping performed in normal operation of multiplexing stage 400B is identical to the mapping performed in normal operation of multiplexing stage 400A. In particular, TX_0, TX_1 and half of TX_4 are mapped to serial data signal 448A while TX_2, TX_3 and the other half of TX_4 are mapped to serial data signal 448B.

Alternately, the control signal 458B can enable a first test mode wherein the first and second static multiplexers 432A and 432B select test signal 460 from test signal generator 434 and provide the test signal 460 to output multiplexers 421-422. The operation of the third and fourth static multiplexers 462A and 462B during the first test mode is the same as during normal operation. Further, the mapping performed in the first test mode of multiplexing stage 400B is identical to the mapping performed in the test mode of multiplexing stage 400A. In particular, TX_0, TX_1 and test signal 460 are mapped to serial data signal 448A while TX_2, TX_3 and test signal 460 are mapped to serial data signal 448B. Thus, in the first test mode of multiplexing stage 400B, TX_4 data is replaced with test signal 460, allowing end-to-end testing of input parallel data lanes TX_0-TX_3.

Alternately, the control signal 458B can enable a second test mode wherein the first static multiplexer 432A selects test signal 460 and provides it to output multiplexer 421. Second static multiplexer 432B selects the retimed data signal from signal lane 446J and provides it to output multiplexer 422. Third static multiplexer 462A selects test signal 460 and provides it to output multiplexer 422. Finally, fourth static multiplexer 462B selects the retimed data signal from signal lane 446I and provides it to output multiplexer 422. The mapping performed in the second test mode of multiplexing stage 400B maps TX_0, TX_1 and test signal 460 to serial data signal 448A, while TX_2, TX_4 and test signal 460 are mapped to serial data signal 448B. Thus, in the second test mode of multiplexing stage 400B, TX_3 data is replaced with test signal 460, allowing end-to-end testing of input parallel data lanes TX_0-TX_2 and TX_4.

Multiplexing stages 400A and 400B are two examples of multiplexing stages that can be implemented to provide a 5:2 parallel-to-serial mapping function. Other multiplexing stages can provide other parallel-to-serial mapping functions, such as 10:4, 16:1, or the like. However, embodiments of the invention are not limited to a particular multiplexing stage configuration and/or parallel-to-serial mapping function. Accordingly, modifications and/or adaptations of the multiplexing stages 400A and 400B to provide different parallel-to-serial mapping functions and/or other functionality are contemplated as being within the scope of the invention.

IV. Test-Mode Enabled Deserializer

Figure 5:
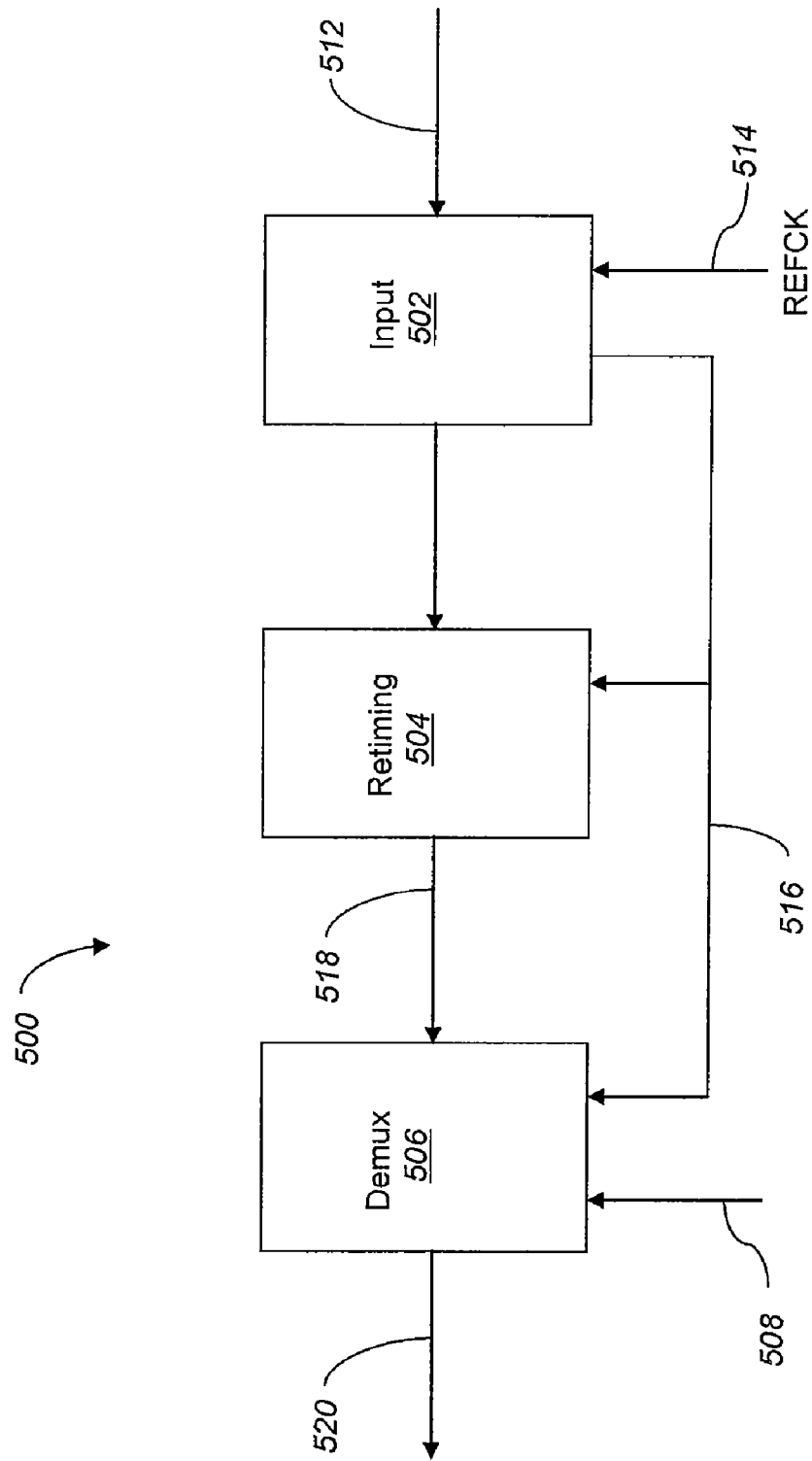
FIG. 5 illustrates an embodiment of a test-mode enabled deserializer IC.

Now with reference to FIG. 5, a deserializer 500 is disclosed that may correspond to one or more of the deserializers 252, 254 of FIG. 2. As such, the deserializer 500 can be configured to deserialize two, e.g., half, of four serial data signals received from the plurality of post amplifiers 242-248 into five parallel data signals, while a second similarly configured deserializer deserializes the other two serial data signals into five other parallel data signals. Alternately, the deserializer 500 can be configured to deserialize more or less than half of a plurality of serial data signals received from a plurality of post amplifiers into more or less than five parallel data signals. Furthermore, the deserializer 500 is configured to support one or more test modes to enable the end-to-end testing of specific lanes in a communication link, such as the link 100 of FIG. 1, as will be described in greater detail below.

FIG. 5 illustrates a simplified block view of example deserializer 500. The deserializer 500 includes an input stage 502, retiming stage 504, and demultiplexing stage 506. One or more mode-selection signals 508 can be provided by a microcontroller, for example, to control one or more of the components 502-506 of the deserializer 500. For instance, mode-selection signal 508 can enable one or more test modes in the demultiplexing stage 506.

The input stage 502 is coupled to retiming stage 504, which is coupled to demultiplexing stage 506. In operation, input stage 502 receives one or more input serial data signals 512 from one or more corresponding post amplifiers, for example. In some embodiments, the input stage 502 can include one or more input nodes with CDRs which use a REFCK signal 514 to recover a clock 516 from the received serial data signal. The recovered clock 516 and/or divided versions thereof can be provided to the components 504 and/or 506 for processing one or more signals. The input serial data signals 512 are provided to retiming stage 504, which retimes the serial data signals 512 into retimed serial data signals 518. The demultiplexing stage demultiplexes or "maps" the retimed serial data signals 518 to a plurality of parallel data signals 520.

In some embodiments, the demultiplexing stage 506 provides a 2:5 serial-to-parallel mapping function, mapping 2×25 G serial data signals into 5×10 G parallel data signals. Alternately or additionally, the demultiplexing stage can perform one or more of countless other serial-to-parallel mapping functions. For instance, the demultiplexing stage can provide a 4:10 or 1:16 serial-to-parallel mapping function, or the like.

In the demultiplexing stage of a conventional deserializer, the serial-to-parallel mapping function is often non-deterministic. The non-deterministic nature of the serial-to-parallel mapping can thus complicate the testing of specified serial input and/or parallel output lanes of a conventional deserializer. As will be explained below, however, the demultiplexing stage 506 according to embodiments of the invention can include means for deterministically mapping one or more input serial data signals to a plurality of output parallel data signals.

With additional reference to 6A, one embodiment of a demultiplexing stage 600A is disclosed that may correspond to the demultiplexing stage 506 of FIG. 5. The demultiplexing stage 600A includes one or more input demultiplexers 601-602 coupled to a plurality of synchronizing flip flops 611-615 coupled to a plurality of output multiplexers 621-625. Additionally, the demultiplexing stage 600 includes means 630A for deterministically mapping one or more input serial data signals to a plurality of output parallel data signals ("means 630A").

As shown, the means 630A are coupled between the input demultiplexers 601-602 and synchronizing flip flops 611-615. More particularly, the means 630A are coupled between input demultiplexers 601-602 and synchronizing flip flop 615. In the disclosed embodiment of FIG. 6A, the means 630A includes first and second lock detectors 632A and 632B and interval counter 634. In some embodiments, the first and second lock detectors 632A can comprise PRBS lock detectors and/or can be programmed to the same test signal as the test-signal generator 434 of FIGS. 4A and 4B.

In operation, the input demultiplexers 601-602 demultiplex a plurality of input serial data signals 642A and 642B received from, e.g., the retiming stage 504 of the deserializer 500 of FIG. 5, into a plurality of demultiplexed data signals on signal lanes 644A-644J (referred to collectively herein as "signal lanes 644"). In some embodiments, demultiplexing the serial data signals 642A and 642B to generate demultiplexed data signals includes distributing bits from each serial data signal 642A or 642B across corresponding signal lanes 644 in a pre-defined order 650A, 650B.

For instance, the pre-defined order 650A of input demultiplexer 601 distributes the bits of serial data signal 642A to signal lane 644A, followed by signal lane 644B, followed by signal lane 644C, followed by signal lane 644D, followed by signal lane 644E. Similarly, the pre-defined order 650B of output multiplexer 602 distributes bits of serial data signal 642B to signal lane 644F, followed by signal lane 644G, followed by signal lane 644H, followed by signal lane 644I, followed by signal lane 644J. The pre-defined orders 650A and 650B are provided by way of example only and represent just two of numerous pre-defined orders that can be implemented by the input demultiplexers 601-602 according to embodiments of the invention. In some embodiments, the pre-defined orders 650A and 650B of input demultiplexers 601 and 602 match the pre-defined orders 450A and 450B of output multiplexers 421 and 422 of FIGS. 4A and/or 4B.

The demultiplexed data signals provided on signal lanes 644 are clocked out of the input demultiplexers 601-602 and into the synchronizing flips flops 611-615. The synchronizing flip flops 611-615 synchronize the demultiplexed data signals from signal lanes 644 to generate a plurality of retimed data signals 646. The retimed data signals 646 are clocked out of the synchronizing flip flops 611-615 and into the output demultiplexers 621-625. Finally, the output multiplexers 621-625 multiplex the retimed data signals 646 to generate a plurality of output parallel data signals on signal lanes RX_0 to RX_4 which can be provided to a host (not shown).

One or more clock signals 652, 654, 656 can be provided to the input demultiplexers 601-602, synchronizing flip flops 611-615, and output multiplexers 621-625 during operation of the demultiplexing stage 600A. In some embodiments, the clock signals 652, 654, 656 correspond to the recovered clock signal 516, or a divided-down version of the recovered clock signal 516, of FIG. 5.

Additionally, a control signal 658A can enable one or more test modes in the demultiplexing stage 600A in conjunction with means 630A. The control signal 658A can be provided by a microcontroller (not shown) and may correspond to the control signal 508 of FIG. 5. In some embodiments, the demultiplexing stage 600A is configured for normal operation and a single test mode. During normal operation, the control signal 658A disables test mode such that each of the lock detectors 632A and 632B is turned off and/or disabled. In normal operation, demultiplexed data signals on signal lanes 644C and 644H are provided from input demultiplexers 601 and 602 to synchronizing flip flop 615. Moreover, demultiplexed data signals on signal lanes 644A-644B and 644D-644E are provided directly to synchronizing flip flops 611 and 612, respectively, while demultiplexed data signals on signal lanes 644F-644G and 644I-644J are provided directly to synchronizing flip flops 613 and 614. Consequently, in normal operation in the embodiment of FIG. 6A, serial data signal 642A is mapped to RX_0, RX_1, and half of RX_4, while serial data signal 642B is mapped to RX_2, RX_3, and the other half of RX_4.

Alternately, the control signal 658A can enable a test mode such that the first and second lock detectors 632A and 632B search for test signal lock on demultiplexed data signals on signal lanes 644C and 644H, respectively. The interval counter 634 provides a time period for the first and second lock detectors 632A and 632B to find test signal lock. If test signal lock is not achieved in that time period, the interval counter notifies the first and second lock detectors 632A and 632B via signal 660 that the time period has expired. In response, each of the first and second lock detectors 632A and 632B instructs the input demultiplexers 601 and 602 via signals 662A, 662B, respectively, to delay the distribution of bits to corresponding signal lanes 644 by one bit. The process of searching for test signal lock, notifying the first and second lock detectors 632A and 632B of expiration of the time period, and instructing the input demultiplexers 601-602 to delay the distribution of bits to corresponding signal lanes 644 by one bit can be repeated by the demultiplexing stage 600A until test signal lock is achieved, for example.

Figure 6A:
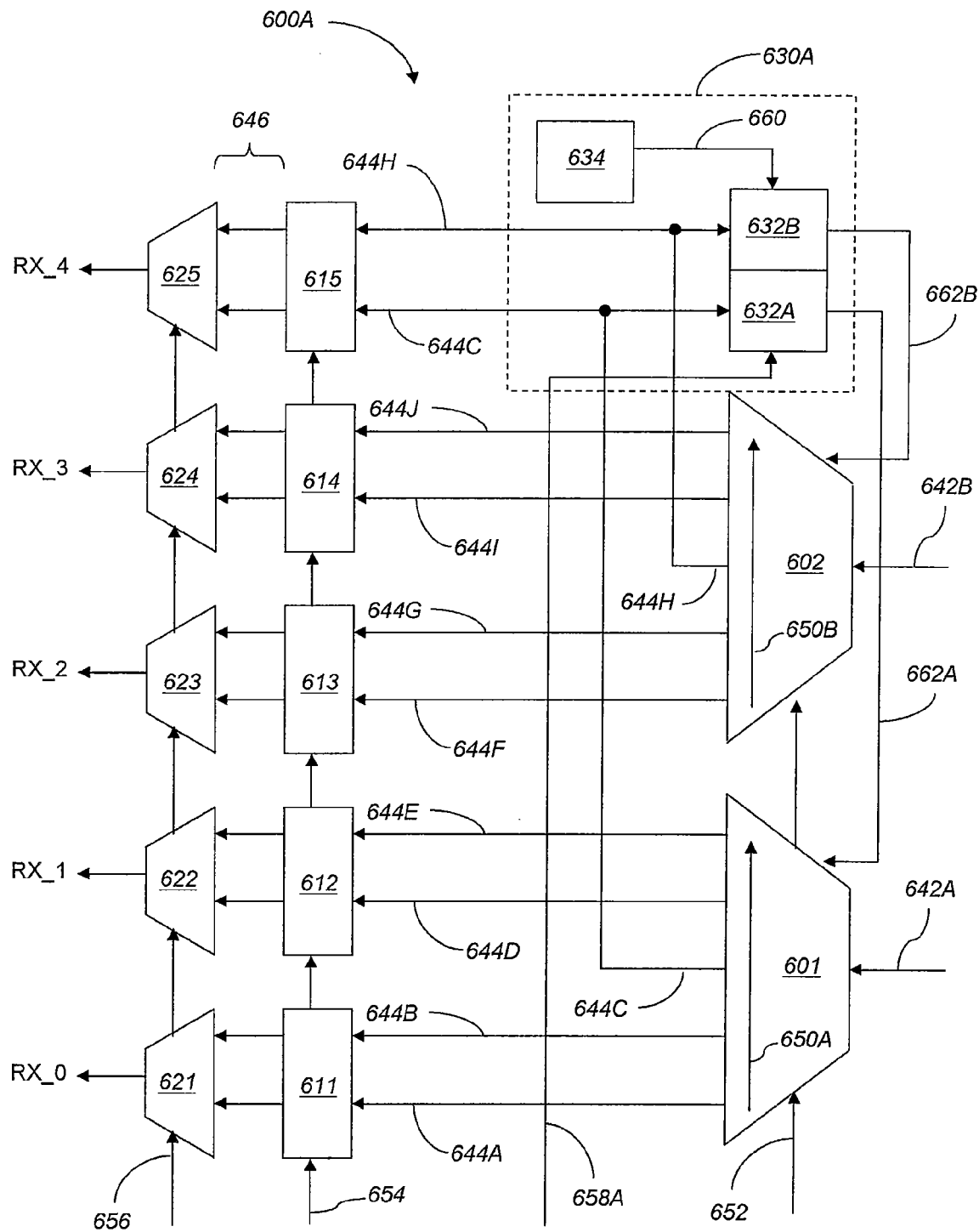
FIGS. 6A and 6B illustrate two embodiments of a demultiplexing stage that can be included in the deserializer IC of FIG. 5 to enable one or more test modes.

Moreover, during the test mode in the embodiment of FIG. 6A, demultiplexed data signals on signal lanes 644A-644B and 644D-644E are provided directly to synchronizing flip flops 611 and 612, respectively, while demultiplexed data signals on signal lanes 644F-644G and 644I-644J are provided directly to synchronizing flip flop 613 and 614, respectively. Consequently, after test signal lock is achieved during the test mode in the embodiment of FIG. 6A, serial data signal 642A is mapped to RX_0, RX_1, and a first test signal on signal lane 644C, while serial data signal 642B is mapped to RX_2, RX_3, and a second test signal on signal lane 644H.

Once test signal lock is achieved in the embodiment of FIG. 6A, each bit in each serial data signal 642A, 642B can be correlated with a particular one of the parallel data signals RX_0 through RX_3. However, in this test mode of demultiplexing stage 600A, data for RX_4 has been replaced by test signals on signal lanes 644C and 644H, preventing end-to-end testing of RX_4.

Figure 6B:
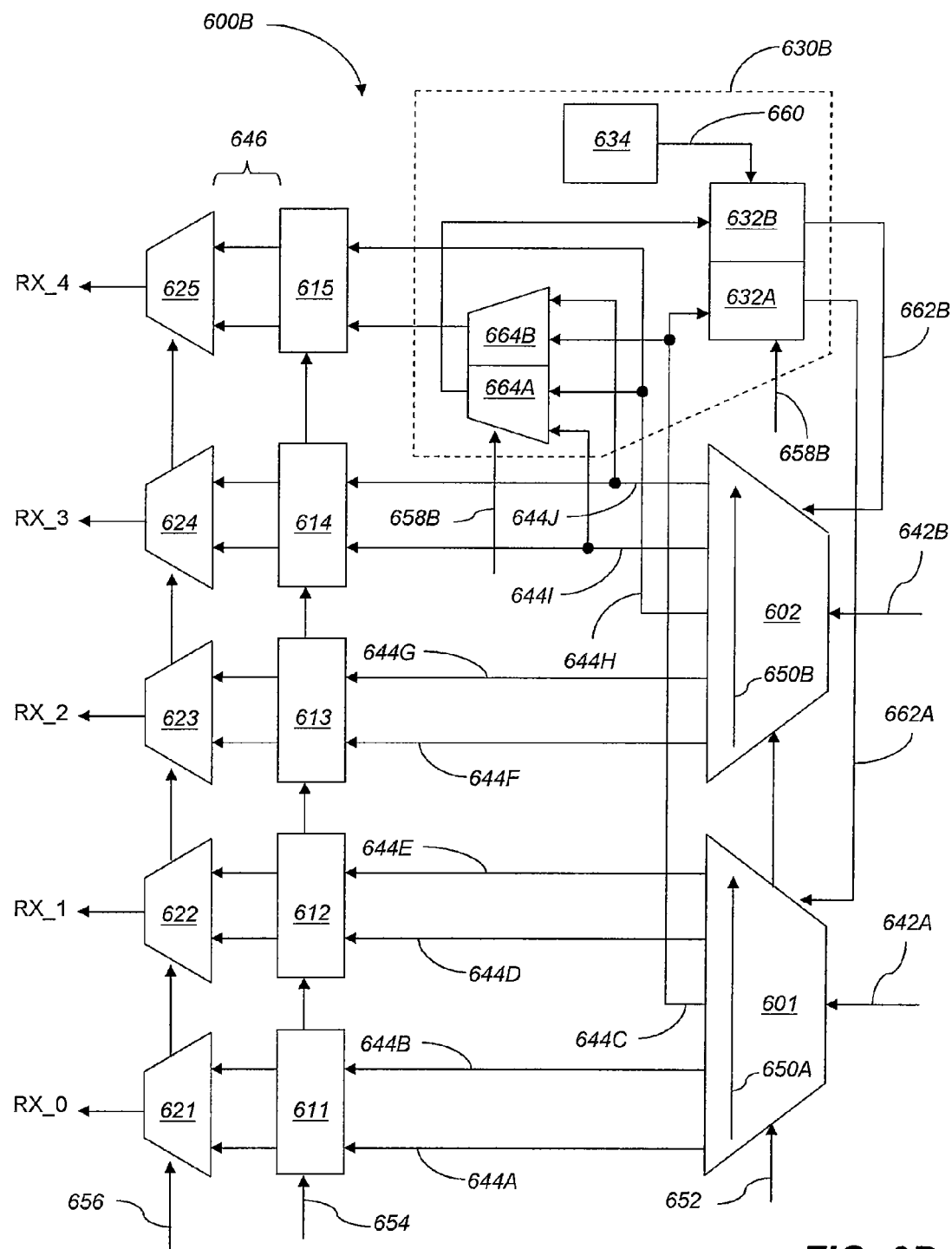

Turning now to FIG. 6B, a second embodiment of a demultiplexing stage 600B is disclosed that may correspond to the demultiplexing stage 506 of FIG. 5. The demultiplexing stage 600B of FIG. 6B is similar in some respects to the demultiplexing stage 600A of FIG. 6A and can comprise some of the same components, including one or more input demultiplexers 601-602 coupled to synchronizing flip flops 611-615 coupled to output multiplexers 621-625. In contrast to the demultiplexing stage 600A, however, demultiplexing stage 600B includes means 630B for deterministically mapping one or more input serial data signals to a plurality of output parallel data signals that further enables end-to-end testing of all of the output parallel signal lanes ("means 630B").

As shown, means 630B are coupled between input demultiplexers 601-602 and synchronizing flip flops 611-615. In the embodiment of FIG. 6B, the means 630B include first and second lock detectors 632A and 632B, interval counter 634, and first and second static multiplexers 664A and 664B.

In some embodiments, the demultiplexing stage 600B can be configured for normal operation and two or more different test modes. During normal operation, control signal 658B disables test mode such that each of the first and second lock detectors 632A and 632B are turned off. A demultiplexed data signal on signal lane 644C is provided from input demultiplexer 601 to synchronizing flip flop 615 via second static multiplexer 664B. A demultiplexed data signal on signal lane 644H is provided directly from input demultiplexer 602 to synchronizing flip flop 615. Moreover, demultiplexed data signals on signal lanes 644A-644B and 644D-644E are provided directly to synchronizing flip flops 611 and 612, respectively, while demultiplexed data signals on signal lanes 644F-644G and 644I-644J are provided directly to synchronizing flip flops 613 and 614. Consequently, in normal operation in the embodiment of FIG. 6B, serial data signal 642A is mapped to RX_0, RX_1, and half of RX_4, while serial data signal 642B is mapped to RX_2, RX_3, and the other half of RX_4, just as in normal operation in the embodiment of FIG. 6A.

Alternately, the control signal 658B of FIG. 6B can enable a first test mode wherein the first and second lock detectors 632A and 632B search for test signal lock on the demultiplexed data signals on signal lanes 644C and 644H, respectively. In particular, first lock detector 632A searches for test signal lock on the demultiplexed data signal on signal lane 644C; second lock detector 632B searches for test signal lock on the demultiplexed data signal on signal lane 644H, which is received via first static multiplexer 664A. During the first test mode, the demultiplexer stage 600B of FIG. 6B can engage in a process of the lock detectors 632 searching for test signal lock on the demultiplexed signals on signal lanes 644C and 644H, the interval counter 634 notifying the lock detectors 632 when a time period expires, and if test signal lock is not achieved, the lock detectors 632 instructing the input demultiplexers 601 and 602 to delay the distribution of bits to corresponding signal lanes 644 by one bit. This process can be repeated until test signal lock is achieved, for example.

Moreover, during the first test mode in the embodiment of FIG. 6B, demultiplexed data signals on signal lanes 644A-644B and 644D-644E are provided directly to synchronizing flip flops 611 and 612, respectively, while demultiplexed data signals on signal lanes 644F-644G and 644I-644J are provided directly to synchronizing flip flop 613 and 614, respectively. Consequently, when test signal lock is achieved during the first test mode in the embodiment of FIG. 6B, serial data signal 642A is mapped to RX_0, RX_1, and a first test signal on signal lane 644C, while serial data signal 642B is mapped to RX_2, RX_3, and a second test signal on signal lane 644H, just as in the test mode in the embodiment of FIG. 6A. Thus, in the first test mode of demultiplexing stage 600B, data for RX_4 has been replaced by test signals on signal lanes 644C and 644H, allowing end-to-end testing of output parallel data lanes RX_0-RX_3.

Alternately, the control signal 658B of FIG. 6B can enable a second test mode wherein the first and second lock detectors 632A and 632B search for test signal lock on demultiplexed data signals on signal lanes 644C and 644I, rather than on signal lanes 644C and 644H. In particular, first lock detector 632A searches for test signal lock on the demultiplexed data signal on signal lane 644C; second lock detector 632B searches for test signal lock on the demultiplexed data signal on signal lane 644I, which is received via first static multiplexer 664A. During the second test mode, the demultiplexer stage 600B can engage in a process of the lock detectors 632 searching for test signal lock on the demultiplexed data signals on signal lanes 644C and 644I, the interval counter 634 notifying the lock detectors 632 when a time period expires, and if test signal lock is not achieved, the lock detectors 632 instructing the input demultiplexers 601 and 602 to delay the distribution of bits to corresponding signal lanes 644 by one bit. This process can be repeated until test signal lock is achieved, for example.

Moreover, during the second test mode in the embodiment of FIG. 6B, the demultiplexed data signal on signal lane 644J is provided from input demultiplexer 602 to synchronizing flip flop 615 via second static multiplexer 664B. The demultiplexed data signal on signal lane 644H is provided directly from input demultiplexer 602 to synchronizing flip flop 615. Demultiplexed data signals on signal lanes 644A-644B and 644D-644E are provided directly to synchronizing flip flops 611 and 612, respectively, while demultiplexed data signals on signal lanes 644F-644G are provided directly to synchronizing flip flop 613. Consequently, during the second test mode in the embodiment of FIG. 6B, serial data signal 642A is mapped to RX_0, RX_1, and a first test signal 644C, while serial data signal 642B is mapped to RX_2, RX_4, and a second test signal 644I. Thus, in the second test mode of demultiplexing stage 600B, data for RX_3 has been replaced by test signals on signal lanes 644C and 644I, allowing end-to-end testing of output parallel data lanes RX_0-RX_2 and RX_4.

Demultiplexing stages 600A and 600B are two examples of demultiplexing stages that can be implemented to provide a 2:5 serial-to-parallel mapping function. Other demultiplexing stages can provide other serial-to-parallel mapping functions, such as 4:10, 1:16, or the like. However, embodiments of the invention are not limited to a particular demultiplexing stage configuration and/or serial-to-parallel mapping function. Accordingly, modifications and/or adaptations of the demultiplexing stages 400A and 400B to provide different serial-to-parallel mapping functions and/or other functionality are contemplated as being within the scope of the invention.

V. End-to-End Testing

Test-mode enabled serializer, deserializer, and/or serdes ICs that include multiplexing stages (e.g., 400A, 400B) and/or demultiplexing stages (e.g., 600A, 600B) according to embodiments of the invention can provide deterministic parallel-to-serial and/or serial-to-parallel mapping functions and enable end-to-end testing of specific physical paths or signal lanes.

For example, one or more multiplexing stages 400A (FIG. 4A) can be implemented within one or more serializer (or serdes) ICs in the first device 120A in the link 100 of FIG. 1, while one or more demultiplexing stages 600A (FIG. 6A) can be implemented within one or more deserializer (or serdes) ICs in the second device 120B. In this configuration, the serial data signals 448A, 448B generated by the multiplexing stage 400A are converted in the first optoelectronic device 120A to optical signals and transmitted via optical fiber(s) 130A to the second optoelectronic device 120B where the optical signals are converted to serial data signals 642A, 642B.

During normal operation, the multiplexing stage 400A non-deterministically maps TX_0 through TX_4 to serial data signals 448A and 448B. Similarly, the demultiplexing stage 600A non-deterministically maps serial data signals 642A and 652B to RX_0 through RX_4. As a result, some or all of the data for TX_0 might end up on RX_0, RX_1, or RX_4 for instance. Similarly, some or all of the data for each of TX_1 through TX_4 can potentially end up on several of RX_0 through RX_4.

In test mode, however, the multiplexing stage 400A deterministically maps TX_0 through TX_3 to serial data signals 448A and 448B by selecting test signal 460 rather than TX_4 for inclusion in serial data signals 448A and 448B as already explained above. Consequently, some bits on each of the serial data signals 448A and 448B are internally generated markers. Additionally, as explained above, the demultiplexing stage 600A looks for test signal lock on specific signal lanes that bits of each of the serial data signals 642A and 642B are distributed to using means 630A. Thus, the multiplexing stage 400A and demultiplexing stage 600A can be programmed to the same test signal in some embodiments such that the first and second lock detectors 632A and 632B of demultiplexing stage 600A search for the same test signal that is generated by the test signal generator 434 of multiplexing stage 400A.

After test signal lock is achieved, and assuming the pre-defined orders 450A-450B of the multiplexing stage 400A correspond to the pre-defined orders 650A-650B of the demultiplexing stage 600A, input parallel data signal TX_0 is mapped to output parallel data signal RX_0. Similarly, input parallel data signals TX_1, TX_2, and TX_3 are mapped, respectively, to output parallel data signals RX_1, RX_2, and RX_3. End-to-end measurements can now be made on four out of five parallel signal lanes of the link 100 of FIG. 1 (e.g., TX_0 to RX_0, TX_1 to RX_1, TX_2 to RX_2, and TX_3 to RX_3). Further, such measurements also test specific serial lanes between the first and second devices 120A and 120B since the first serial lane (e.g., 448A to 642A) includes TX_0 and TX_1 and the second serial lane (e.g., 448B to 642B) includes TX_2 and TX_3.

Alternately or additionally, end-to-end measurements on all parallel lanes can be made by implementing one or more multiplexing stages 400B (FIG. 4B) within one or more serializer (or serdes) ICs in the first device 120A in the link 100 of FIG. 1 and by implementing one or more demultiplexing stages 600B (FIG. 6B) within one or more deserializer (or serdes) ICS in the second device 120B. During normal operation, the multiplexing stage 400B non-deterministically maps TX_0 through TX_4 to serial data signals 448A and 448B. Similarly, the demultiplexing stage 600B non-deterministically maps serial data signals 642A and 642B to RX_0-RX_4.

In the first test mode, the mappings performed by the multiplexing stage 400B and demultiplexing stage 600B are similar to the mappings performed by the multiplexing stage 400A and demultiplexing stage 600A in their test mode. In particular, multiplexing stage 400B deterministically maps TX_0, TX_1, TX_2, and TX_3 to serial data signals 448A and 448B by replacing TX_4 with test signal 460 in serial data signals 448A and 448B. Demultiplexing stage 600B deterministically maps serial data signals 642A and 642B to RX_0-RX_3 by searching specific signal lanes to lock onto the test signal included in serial data signals 642A and 642B. Once test signal lock is achieved in the first test mode, data signals TX_0, TX_1, TX_2, and TX_3 are mapped, respectively, to RX_0, RX_1, RX_2, and RX_3, allowing end-to-end measurements to be made on four of five parallel data lanes (e.g., TX_0 to RX_0, TX_1 to RX_1, TX_2 to RX_2, and TX_3 to RX_3), not including data lane TX_4 to RX_4, as well as on both of the serial lanes (e.g., 448A to 642A and 448B to 642B).

In the second test mode, however, multiplexing stage 400B deterministically maps TX_0, TX_1, TX_2 and TX_4 to serial data signals 448A and 448B by replacing TX_3 with test signal 460 in serial data signals 448A and 448B. In the second test mode, demultiplexing stage 600B deterministically maps serial data signals 642A and 642B to RX_0-RX_2 and RX_4 by searching specific signal lanes to lock onto the test signal included in serial data signals 642A and 642B. Once signal lock is achieved in the second test mode, data signals TX_0, TX_1, TX_2, and TX_4 are mapped, respectively, to RX_0, RX_1, RX_2, and RX_4.

Accordingly, in the first test mode, end-to-end measurements can be made on all data lanes except TX_4 to RX_4; in the second test mode, end-to-end measurements can be made on all data lanes except TX_3 to RX_3.

It will be appreciated that embodiments of the invention enable end-to-end testing of high-speed data lanes using relatively lower-speed test equipment, such as the testing of 25 G data lanes using 10 G equipment. For instance, the first device 120A of FIG. 1 can include two 5:2 serializer (or serdes) ICs, each serializer IC including a multiplexing stage 400A or 400B configured to multiplex 5×10 G input parallel data signals into 2×25 G output serial data signals for an aggregate 100 G transmit data rate. The second device 120B can include two 2:5 deserializer (or serdes) ICs, each deserializer IC including a demultiplexing stage 600A or 600B configured to demultiplex 2×25 G input serial data signals into 5×10 G output parallel data signals for an aggregate 100 G receive data rate. Optionally, the first device 120A can additionally include two 2:5 deserializer ICs and the second device 120B can additionally include two 5:2 serializer ICs.

According to this embodiment, and during each of the one or more test modes of the multiplexing stages 400A or 400B and demultiplexing stages 600A or 600B, each 25 G serial data signal will be made up of two deterministically mapped 10 G parallel data signals and a test signal. As a result, each 25 G serial data signal can be isolated and tested with 10 G equipment by testing the two 10 G parallel data signals making up each 25 G serial data signal.

The principles of the invention have been described in the context of 100 G communication links with 10×10 G host-to-device/device-to-host interfaces and 4×25 G device-to-device interfaces. However, the principles of the invention can alternately or additionally be implemented in communication links with aggregate data rates other than 100 G, host-to-device/device-to-host interfaces other than 10×10 G, and/or device-to-device interfaces other than 4×25 G.

The embodiments described herein may include the use of a special purpose or general-purpose computer including various computer hardware or software modules, as discussed in greater detail below.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" can refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A multiplexing stage, comprising:
a plurality of input demultiplexers configured to demultiplex a plurality of parallel data signals into a plurality of demultiplexed signals;
a plurality of synchronizing flip flops, each coupled to a different one of the plurality of input demultiplexers and configured to receive and synchronize the plurality of demultiplexed signals into a plurality of retimed signals;
one or more output multiplexers coupled to the synchronizing flip flops and configured to sample the plurality of retimed signals in a pre-defined order to generate one or more serial data signals therefrom; and
means for deterministically mapping the plurality of parallel data signals to the one or more serial data signals, the means for deterministically mapping being coupled between the one or more output multiplexers and at least one of the plurality of synchronizing flip flops, wherein the means for deterministically mapping includes a first plurality of static multiplexers coupled between the one or more output multiplexers and a first synchronizing flip flop, the first plurality of static multiplexers configured to select either a test signal or a first set of the plurality of demultiplexed signals for inclusion in the one or more serial data signals.

2. The multiplexing stage of claim 1, further comprising a pseudo-random bit stream generator configured to generate the test signal.

3. The multiplexing stage of claim 1, wherein the means for deterministically mapping further includes a second plurality of static multiplexers coupled between a first output multiplexer and a second synchronizing flip flop, the second plurality of static multiplexers configured to select either the test signal and part of the first set of the plurality of demultiplexed signals or a second set of the plurality of demultiplexed signals for inclusion in the one or more serial data signals.

4. The multiplexing stage of claim 3, wherein the first set of the plurality of demultiplexed signals corresponds to one parallel data signal included in the plurality of parallel data signals and the second set of the plurality of demultiplexed signals corresponds to another parallel data signal included in the plurality of parallel data signals.

5. A multiplexing stage, comprising:
a plurality of input demultiplexers configured to demultiplex a plurality of parallel data signals into a plurality of demultiplexed signals;
a plurality of synchronizing flip flops, each coupled to a different one of the plurality of input demultiplexers and configured to receive and synchronize the plurality of demultiplexed signals into a plurality of retimed signals;
one or more output multiplexers coupled to the synchronizing flip flops and configured to sample the plurality of retimed signals in a pre-defined order to generate one or more serial data signals therefrom; and
means for deterministically mapping the plurality of parallel data signals to the one or more serial data signals, the means for deterministically mapping being coupled between the one or more output multiplexers and at least one of the plurality of synchronizing flip flops, wherein the multiplexing stage is configured to:
multiplex five parallel data signals, each having a data rate substantially equal to 10 Gigabits per second, into two serial data signals, each having a data rate substantially equal to 25 Gigabits per second; or
multiplex ten parallel data signals, each having a data rate substantially equal to 10 Gigabits per second, into four serial data signals, each having a data rate substantially equal to 25 Gigabits per second.

6. A demultiplexing stage, comprising:
one or more input demultiplexers configured to demultiplex one or more serial data signals into a plurality of demultiplexed signals;
a plurality of synchronizing flip flops coupled to the one or more input demultiplexers and configured to receive and synchronize the plurality of demultiplexed signals into a plurality of retimed signals;
a plurality of output multiplexers coupled to the plurality of synchronizing flip flops and configured to multiplex the plurality of retimed signals into a plurality of serial data signals; and
means for deterministically mapping the one or more serial data signals to the plurality of serial data signals, the means for deterministically mapping being coupled between the one or more input demultiplexers and at least one of the plurality of synchronizing flip flops.

7. The demultiplexing stage of claim 6 configured to:
demultiplex two serial data signals, each having a data rate substantially equal to 25 Gigabits per second, into five parallel data signals, each having a data rate substantially equal to 10 Gigabits per second; or
demultiplex four serial data signals, each having a data rate substantially equal to 25 Gigabits per second, into ten parallel data signals, each having a data rate substantially equal to 10 Gigabits per second.

8. The demultiplexing stage of claim 6, wherein the means for deterministically mapping includes a plurality of lock detectors coupled between the one or more input demultiplexers and a first synchronizing flip flop, the plurality of lock detectors configured to search the plurality of demultiplexed signals for a test signal included in the one or more serial data signals.

9. The demultiplexing stage of claim 8, further comprising an interval counter configured to notify the plurality of lock detectors when a time period expires.

10. The demultiplexing stage of claim 9, wherein:
the one or more input demultiplexers demultiplex the one or more serial data signals into the plurality of demultiplexed signals by distributing bits of the one or more serial data signals onto a plurality of signal lanes in a pre-defined order;
the plurality of lock detectors are configured to search for the test signal on specific signal lanes included in the plurality of signal lanes; and
the plurality of lock detectors are further configured to instruct the one or more input demultiplexers to delay by one the distribution of bits of the one or more serial data signals onto the plurality of signal lanes when the plurality of lock detectors do not find the test signal on the specific signal lanes before the time period expires.

11. The demultiplexing stage of claim 8, wherein the means for deterministically mapping further includes a plurality of static multiplexers coupled between a first input demultiplexer, the first synchronizing flip flop, and a first lock detector, the plurality of static multiplexers configured to:
in normal operation, select one of the plurality of demultiplexed signals on a first signal lane to provide to the first synchronizing flip flop;
in a first test mode, select one of the plurality of demultiplexed signals on a second signal lane to provide to one of the plurality of lock detectors; and
in a second test mode, select one of the plurality of demultiplexed signals on a third signal lane to provide to the first synchronizing flip flop and select one of the plurality of demultiplexed signals on a fourth signal lane to provide to the one of the plurality of lock detectors.

12. A method of deterministically mapping a plurality of parallel data signals to at least one serial data signal, comprising:
receiving a plurality of input parallel data signals at a first optoelectronic device;
replacing one of the plurality of input parallel data signals with a first test signal;
multiplexing the first test signal and all but the one of the plurality of input parallel data signals into at least one serial data signal; and
transmitting the plurality of serial data signals to a second optoelectronic device, wherein the second optoelectronic device is configured to:
receive the at least one serial data signal;
demultiplex the at least one serial data signal into a plurality of output parallel data signals; and
attempt to lock on to the test signal while demultiplexing the at least one serial data signal into the plurality of output parallel data signals.

13. The method of claim 12, wherein multiplexing the first test signal and all but the one of the plurality of input parallel data signals into at least one serial data signal includes sampling the bits of the first test signal and all but the one of the plurality of input parallel data signals in a first pre-defined order to generate the at least one serial data signal.

14. The method of claim 13, wherein the second optoelectronic device is configured to demultiplex the at least one serial data signal into a plurality of output parallel data signals by distributing the bits of the at least one serial data signal in a second pre-defined order matching the first pre-defined order.

15. The method of claim 12, wherein the plurality of input parallel data signals includes five parallel data signals, each having a data rate substantially equal to 10 gigabits per second, and the at least one serial data signal includes two serial data signals, each having a data rate substantially equal to 25 gigabits per second.

16. The method of claim 15, wherein each of the two serial data signals is generated from a different two of the five parallel data signals and the test signal, allowing each serial data signal having a data rate substantially equal to 25 gigabits per second to be isolated and tested with 10 gigabit per second test equipment by testing the two corresponding parallel data signals included in the serial data signal.

17. A method of deterministically mapping at least one serial data signal to a plurality of parallel data signals, comprising:
receiving, from a first optoelectronic device, at least one serial data signal at a second optoelectronic device;
demultiplexing the at least one serial data signal into a plurality of demultiplexed data signals that includes a test signal;
searching for the test signal on a specific one of a plurality of signal lanes;
locking onto the test signal when it is found on the specific one of the plurality of signal lanes; and
multiplexing the plurality of demultiplexed data signals into a plurality of serial data signals.

18. The method of claim 17, wherein the at least one serial data signal is demultiplexed into a plurality of demultiplexed data signals by at least one input demultiplexer which distributes the bits of the at least one serial data signal to the plurality of signal lanes in a first pre-defined order.

19. The method of claim 18, wherein the second optoelectronic device searches for the test signal on the specific one of the plurality of signal lanes for a first time period and if the first time period expires without finding the test signal, the input demultiplexers are repeatedly instructed after the first and subsequent time periods to delay by one the distribution of bits of the at least one serial data signal to the plurality of signal lanes.

* * * * *